United States Patent [19]

Via

[11] 4,260,465

[45] Apr. 7, 1981

[54] PHOTOPOLYMERIZABLE COMPOSITION STABILIZED WITH EPOXIDE COMPOUNDS AND PROCESS

[75] Inventor: Francis A. Via, Yorktown Hts., N.Y.

[73] Assignee: Stauffer Chemical Company, Westport, Conn.

[21] Appl. No.: 109,941

[22] Filed: Jan. 4, 1980

Related U.S. Application Data

[62] Division of Ser. No. 796,960, May 16, 1977, Pat. No. 4,146,453.

[51] Int. Cl.$^3$ .................................................. C08F 2/50
[52] U.S. Cl. ............................... 204/159.23; 525/11; 260/45.8 A; 526/204
[58] Field of Search ................... 204/159.23, 159.11

[56] References Cited

U.S. PATENT DOCUMENTS

| | | | |
|---|---|---|---|
| 2,448,828 | 9/1948 | Renfrew | 204/159.21 |
| 2,647,080 | 7/1953 | Joyce | 204/159.23 |
| 3,814,702 | 6/1974 | Bourdon et al. | 204/159.23 |
| 3,819,495 | 6/1974 | Roskott et al. | 204/159.19 |
| 3,819,496 | 6/1974 | Roskott et al. | 204/159.19 |
| 3,948,832 | 4/1976 | Hudgin | 260/23 EP |
| 3,991,085 | 11/1976 | Abma et al. | 260/348 R |
| 4,127,542 | 11/1978 | Kaizerman | 260/18 PF |
| 4,141,806 | 2/1979 | Keggenhoff et al. | 204/159.22 |
| 4,146,453 | 3/1979 | Via | 204/159.23 |

FOREIGN PATENT DOCUMENTS

| | | |
|---|---|---|
| 2263804 | 7/1973 | Fed. Rep. of Germany . |
| 47-75638 | 1/1972 | Japan . |
| 48-00983 | 1/1973 | Japan . |

*Primary Examiner*—John C. Bleutge
*Assistant Examiner*—Arthur H. Koeckert
*Attorney, Agent, or Firm*—William C. Gerstenzang

[57] ABSTRACT

A stabilized photopolymerizable composition comprising photopolymerizable ethylenically unsaturated monomeric compounds, a photoinitiator and at least one epoxide compound as a stabilizer.

4 Claims, No Drawings

PHOTOPOLYMERIZABLE COMPOSITION STABILIZED WITH EPOXIDE COMPOUNDS AND PROCESS

This application is a division of U.S. application Ser. No. 796,960 filed May 16, 1977, now U.S. Pat. No. 4,146,453.

BACKGROUND OF THE INVENTION

This invention relates to stabilized photopolymerizable compositions based on photopolymerizable ethylenically unsaturated compounds containing benzoin ether initiators. More particularly, this invention relates to the use of certain epoxide compounds as stabilizers for photopolymerizable compositions containing photoinitiators.

Photopolymerizable compositions containing unsaturated materials and photoinitiating compounds are well known in the art, being particularly useful for moldings and coatings. These materials polymerize at low temperatures when exposed to actinic radiation. While numerous compounds have been found useful as photoinitiators for the polymerization of unsaturated compounds, the ethers of benzoin have found wide-spread commercial acceptance. These benzoin ethers exhibit excellent cure rates, rendering them particularly attractive where rapid hardening is desirable. The use of benzoin ethers as photopolymerization initiators is described in U.S. Pat. No. 2,448,828.

While the benzoin ethers are widely used because of their excellent curing properties, they are not wholly satisfactory with regard to storage stability. Thus, unsaturated systems to which benzoin ethers are added have considerably diminished dark storage stability and will gell prematurely in many systems where storage is a key factor.

Various attempts have been made to remedy this deficiency of the benzoin compounds by including stabilizing additives in the photopolymerizable composition. For example, U.S. Pat. No. 3,814,702 teaches photosensitizing compositions comprising a benzoin ether, an organic acid and a solvent; optionally, a weak reducing agent may be included in the photosensitizing composition. Other multi-component stabilizing systems are described in U.S. Pat. No. 3,819,495, which discloses a copper compound soluble in polyester resin and an organic compound having ionically-bound chlorine or capable of forming chlorine ions in situ as stabilizers for polyester resins containing benzoin ethers, while U.S. Pat. No. 3,819,496 discloses similar systems employing an iron and/or manganese compound instead of the copper compound.

Other compounds have been added to benzoin ether systems as cure accelerators. For example, Japan Kokai 73 00,983 discloses the use of dialkylaminobenzoins in conjunction with benzoin methyl ether as curing agents for polyester resins, while Japan Kokai No. 73 75,638 teaches mixtures of benzoin alkyl ether and p,p'-bis(-dialkylamino)thiobenzophenone as curing agents that provide colored products. In German Offen. No. 2,263,804, the addition of ascorbic acid or thiourea to benzoin ethyl ether to reduce the exposure time of photopolymer printing reliefs is disclosed. While functioning to accelerate curing, many of these compounds are known to decrease the storage stability of the system.

Furthermore, additives to benzoin ether systems to function as stabilizers against discoloration have been proposed. Thus, U.S. Pat. No. 2,647,080 describes the addition of allyl glycidyl ether to systems containing halogen-free acrylate and acyloin ether initiators in order to prevent discoloration of the systems by light.

Now it has been found in accordance with this invention that selected epoxide compounds are excellent stabilizing agents for photopolymerizable compositions containing photoinitiators. These stabilizing agents function to improve the dark storage capability of the composition without significantly detracting from the cure rate.

SUMMARY OF THE INVENTION

The stabilized photopolymerizable composition of this invention comprises an ethylenically unsaturated monomeric compound, a photoinitiator and at least one selected epoxide compound.

DETAILED DESCRIPTION OF THE INVENTION

More in detail, the photopolymerizable composition of this invention comprises at least one photopolymerizable ethylenically unsaturated compound containing a photoinitiator in an amount sufficient to initiate photopolymerization and a stabilizing amount of an epoxide compound having the formula $$R^1-HC-CH-R^2 \quad \text{or}$$
$$\diagdown O \diagup$$

I

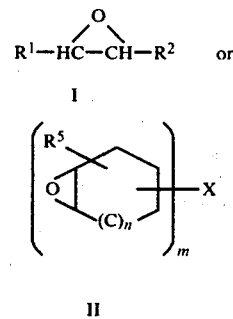

II wherein:
R$^1$ and R$^2$ are
(a) independently selected hydrogen, alkyl of 1 to 18 carbon atoms, aryl of 6 to 13 ring carbon atoms,

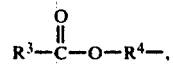

where R$^3$ is alkenyl of 2 to 6 carbon atoms and R$^4$ is alkylene of 1 to 4 carbon atoms or cycloalkenyl oxide of 5 or 6 ring carbon atoms, with the proviso that both R$^1$ and R$^2$ cannot be hydrogen; or
(b) together with the adjacent epoxy carbon atoms form a cyclic hydrocarbon having a total of 5 to 7 ring carbon atoms;
R$^5$ is hydrogen or alkyl of 1 to 4 carbon atoms;
X is oxygen, $$\overset{O}{\underset{\|}{-C}}-O-, \overset{O}{\underset{\|}{-C}}-NR^5,$$

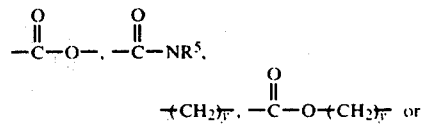

-continued

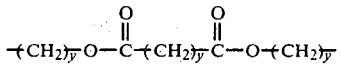

where y is an integer from 1 to 4, m being 2; or

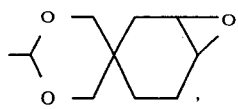

m being 1; and
n is zero or 1.

Illustrative of the epoxides I are epoxypropane; 1,2-epoxybutane; 1,2-epoxyoctadecane; 3,4-epoxyheptane; 1,2-epoxy 4-methyldecane; styrene oxide; naphthalene oxide; cyclohexene oxide; glycidyl acrylate; vinyl cyclopentene dioxide; vinyl cyclohexene dioxide; methylene bis-(cyclohexane oxide); butylene bis-(cyclohexane oxide); 3,4-epoxycyclohexylmethyl-3,4-epoxycyclohexane carboxylate; 3,4-epoxycyclohexylbutyl-3,4-epoxycyclohexane carboxylate; 3,4-epoxycyclohexane acetamide; bis-(2,3-epoxycyclopentyl) ether; bis-(3,4-epoxy-6-methylcyclohexylmethyl) adipate; 2-(3,4-epoxycyclohexyl)-5-5-spiro-(3,4 epoxy) cyclohexane-m-dioxane; etc.

The epoxides I are known compounds, many of which are commercially available. Alternately they are readily prepared by methods described in the literature. For example, some of them can be prepared by oxidation of the corresponding olefin with a per-acid as described by Y. R. Nanes and P. Bachman in Helv. 28, 1227 (1945). Oxidation of the olefin with vanadium pentoxide and hydrogen peroxide to provide epoxides is disclosed by W. Treibs in Ang. Chemie 52, 698 (1939), while P. Karrer and H. Sturzingler in Helv. 29, 1829 (1946) teach oxidation of olefins with hydrogen peroxide.

The stabilizer is generally employed in an amount from about 0.01 to about 30% by weight of the initiator and preferably from about 0.5 to about 5.0% by weight of the initiator. The initiator is generally employed in an amount from about 0.01 to about 30%, and preferably from about 1 to about 5% loading by weight of the total composition.

Photopolymerizable ethylenically unsaturated compounds useful in the compositions of this invention include acrylic, α-alkacrylic and α-chloroacrylic acid compounds such as esters, amides and nitriles. Examples of such compounds are acrylonitrile, methacrylonitrile, methyl acrylate, ethyl acrylate, methyl methacrylate, isobutyl methacrylate, 2-ethyl-hexyl acrylate, methacrylamide and methyl α-chloroacrylate. Also useful, although not preferred, are vinyl and vinylidene esters, ethers and ketones. Additionally, compounds having more than one terminal unsaturation can be used. Examples of these include diallyl phthalate, diallyl maleate, diallyl fumarate, triallyl cyanurate, triallyl phosphate, ethylene glycol dimethacrylate, glycerol trimethacrylate, pentaerythritol triacrylate, pentaerythritol tetraacrylate, trimethylolpropane triacrylate, methacrylic anhydride and allyl ethers of monohydroxy or polyhydroxy compounds such as ethylene glycol diallyl ether, pentaerythritol tetraallyl ether, and the like. Nonterminally unsaturated compounds such as diethyl fumarate can similarly be used.

The derivatives of acrylic acid, which include the derivatives of methacrylic acid, are particularly well suited to the practice of the invention and are consequently preferred components as monomers in monomer-containing polymerizable systems and as reactive centers in polymerizable polymers.

The photoinitiators suitable for use in the practice of this invention include various carbonyl compounds including the acetophenones, benzophenones, etc.; the acyloins; etc. Preferred are the benzoin ether initiators of the formula

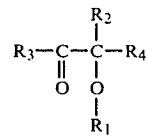

wherein $R_1$ and $R_2$ are, independently from one another, selected from hydrogen atoms, or aliphatic or aromatic hydrocarbon radicals, and $R_3$ and $R_4$ are, independently from one another, benzene nuclei, or benzene nuclei mono-, di- or tri-substituted with alkyl, alkoxy, trihaloalkyl, metahydroxy, alkyenedioxy groups or halogen atoms.

The benzoin ethers are known photosensitizers that may be prepared according to the method described by Whitmore in Organic Chemistry, page 405, by Fisher in Berichte, 26,2412 (1893), or by Irvine and Moodie as described in Journal Chemistry Society, 91, 543, (1907).

Among the various benzoin ethers suitable for the purposes of the invention are in particular the phenyl, cresyl, benzyl, cyclohexyl ethers thereof and alkyl ethers thereof such as the methyl, ethyl, propyl, isopropyl, butyl and isobutyl ethers, and isomers thereof.

While any of the epoxide compounds having the formula I can be used in the practice of this invention, preferred are compounds I where $R^1$ and $R^2$ are independently selected hydrogen, alkyl of 5 to 18 carbon atoms;

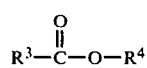

where $R^3$ is alkenyl of 3 or 4 carbon atoms and $R^4$ is alkylene of 1 or 2 carbon atoms or cyclohexenyl oxide, or together with the adjacent epoxy carbon atoms form a cyclic hydrocarbon having a total of 5 to 7 ring carbon atoms, and those compounds II where $R^5$ is hydrogen or methyl; X is oxygen,

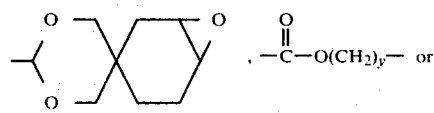

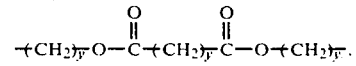

Additionally, the photopolymerizable composition can contain antioxidants and stabilizers such as phenylnaphthylamine, etc.

Co-stabilizers can also be employed in the practice of this invention. Thus, nitrogen-containing aromatic compounds such as those disclosed in U.S. Pat. No. 4,141,807, and ammonium salts of phosphorus acid as disclosed in U.S. Pat. No. 4,077,860, can be added to the photopolymerizable composition.

Thus, it is seen that the constitution of photopolymerizable compositions which can be used in the practice of the invention is widely variable. However, the compounds enumerated above are purely illustrative. Materials subject to polymerization by actinic radiation as well as permissable variations and substitutions of equivalent components within particular types of compositions are well known to those skilled in the art.

The photopolymerizable compositions of this invention have been found to have markedly enhanced dark-storage capability over corresponding systems not including the epoxide containing compounds I.

The process can be carried out by mixing a quantity of a photoinitiating compound and a stabilizer of the invention with a photopolymerizable composition and exposing the resultant mixture to actinic radiation. Alternatively, a one-component system comprising the photopolymerizable composition, the stabilizer of the invention and, if desired, appropriate pigmentation, can be stored in the dark for a prolonged period of time prior to use without fear of gelation.

A preferred manner of practicing the invention is by the use of photopolymerizable molding and coating compositions which consist of mixtures of unsaturated polymeric compounds and monomeric compounds copolymerizable therewith. The polymeric compounds can be conventional polyesters prepared from unsaturated polycarboxylic acids such as maleic acid, fumaric acid, glutaconic acid, itaconic acid, citraconic acid, mesaconic acid and the like, and polyhydric alcohols such as ethylene glycol, diethylene glycol, glycerol, propylene glycol, 1,2-butanediol, 1,4-butanediol, pentaerythritol, trimethylolpropane and the like. The carboxylic acid content can also contain saturated components. The inclusion of a monobasic fatty acid content, either as such or in the form of a triglyceride or oil, in the photopolymerizable polyester composition to comprise an alkyd resin is also acceptable. These resins can, in turn, be modified by silicones, epoxides, isocyanates, etc., by known techniques.

The compositions of the instant invention after being prepared in the ratios as set out above can be applied to the material to be coated by conventional means, including brushing, spraying, dipping, curtain and roll coating techniques, and may, if desired, be dried under ambient or oven conditions to provide coating films on the substrate. The substrate can be of any composition, e.g., wood, metal, paper, plastic, fabric, fiber, ceramic, concrete, plaster, glass, etc.

After the composition is applied to the desired substrate, it is exposed to light radiation having wave lengths of above about 2000 Angstrom units, preferably from about 2000 up to about 8000 Angstroms, and most preferably between about 2400 Angstroms and 5400 Angstroms. Exposure should be from a source located about 1 to 5 inches from the coating for a time sufficient to cause crosslinking of the composition and can range from about 0.1 seconds up to about 1 min./linear ft. Generally, the light radiation will have power of about 200 watts per linear inch.

The light radiation can be ultraviolet light generated from low, medium and high pressure mercury lamps. This equipment is readily available and its use is well known to those skilled in the art of radiation chemistry. Other sources include electron beam radiation, plasma arc, laser beams, etc.

In the following examples, which will serve to illustrate the practice of this invention, all parts and percentages are by weight unless otherwise specified.

EXAMPLE 1

An epoxide having the formula

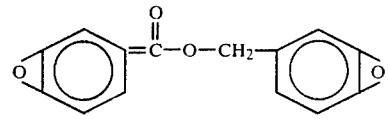

was added in various concentrations to samples of Satomer SR 351 resin containing 3.6% by weight of benzoin isobutyl ether initiator. The epoxide is available as ERL-4221 from Union Carbide Chemical Corp. Satomer SR 351 resin is trimethylolpropane triacrylate marketed by Satomer Company. Glass jars were filled to greater than 90% by volume with the stabilized compositions, which were then stored in the dark at 65° C. Stability is reported in Table 1 as the number of days the compositions remained stable prior to gelation. The symbol ">" indicates that gelation had not occurred when inspected after the indicated number of days in storage.

TABLE 1

| Sample | Concentration of ERL-4221 (% by Wt. of Total Formulation) | Stability (Days of 65° C.) |
|---|---|---|
| 1 | 0 | 4.0 |
| 2 | 0.04 | 37.0 |
| 3 | 0.10 | >50.0 |
| 4 | 0.20 | >50.0 |
| 5 | 0.36 | 49.0 |
| 6 | 0.62 | 48.0 |
| 7 | 1.2 | 11.0 |

EXAMPLES 2–6

Various epoxides were added to Satomer SR 351 resin containing 3.6% by weight of benzoin isobutyl ether. Satomer SR 351 resin is trimethylolpropane triacrylate marketed by Satomer Company. Stability was determined as described in Example 1; the results are set forth in Table 2.

TABLE 2

| Example | Stabilizer | Concentration (% by Wt. of Resin) | Stability (Days at 65° C.) |
|---|---|---|---|
| 2 | ERL-4221 | 1.0 | 28.0 |
| 3 | Styrene Oxide | 1.4 | 1.6 |
| 4 | Cyclohexane Oxide | 1.1 | 7.0 |
| 5 | Glycidyl Acrylate | 1.3 | >50.0 |
| 6 | 1,2-Epoxydecane | 1.4 | 43.0 |

EXAMPLES 7–8

These examples reflect stability tests in pentaerythritol tetraacrylate resin containing 1.2% by weight of benzoin isobutyl ether initiator. The testing was carried out following the procedure described in Example 1; the results are reported in Table 3.

TABLE 3

| Example | Stabilizer | Concentration (% by Wt. of Resin) | Stability (Days at 65° C.) |
|---|---|---|---|
| Control | None | — | 1.0 |

TABLE 3-continued

| Example | Stabilizer | Concentration (% by Wt. of Resin) | Stability (Days at 65° C.) |
|---|---|---|---|
| 7 | 1,2-Epoxydecane | 0.05 | 3.0 |
| 8 | Glycidyl Acrylate | 0.05 | 3.0 |

EXAMPLES 9-15

The following stability tests indicate the effect when epoxides in combination with other stabilizers and additives are added to various resins. The testing was carried out in accordance with the procedure described in Example 1; the results are set forth in Table 4. All the resins contained benzoin isobutyl ether as the initiator.

TABLE 4

| Example | Stabilizer and Concentration as Wt. % of Resin | Initiator Concentration as Wt. % of Resin | Stability (Days at 65° C.) | | | |
|---|---|---|---|---|---|---|
| | | | Satomer[1] Sr 351 | PEA[2] | PETA[3] | HDODA[4] |
| Control | None | 3.6 | 4.0-5.0 | 1.0 | 1.0 | 1.0 |
| 9 | 0.14% ERL-4221 | 3.6 | 60.0 | — | — | — |
| 10 | 0.17% ERL-4221 and 0.17% 8-Hydroxyquinoline | 3.6 | >100.0 | — | — | — |
| 11 | 0.17% ERL-4221 and 0.17% phenyl-α-naphthylamine | 3.6 | 63.0 | — | — | — |
| 12 | 0.07% ERL-4221 and 0.07% phenyl-α-naphthylamine | 3.6 | >24.0 | >20.0 | 1.0 | 1.0 |
| 13 | 0.02% ERL-4221 and 0.02% phenyl-α-naphthylamine | 1.2 | — | 12.0 | 3.0 | 1.0 |
| 14 | 0.02% ERL-4221 and 0.02% phenyl-α-naphthylamine and 0.02% 8-hydroxyquinoline | 1.2 | — | — | 6.0 | 1.6 |
| 15 | 0.17% ERL-4221 and 0.17% decyl trimethylammonium diphenylphosphate | 3.6 | 4.0 | — | — | — |

[1]Trimethylolpropane triacrylate marketed by Satomer Company.
[2]Pentaerythritol acrylate marketed by Union Carbide Corporation.
[3]Pentaerythritol tetraacrylate marketed by Satomer Company.
[4]1,6 Hexanediol diacrylate marketed by Celanese Corporation.

EXAMPLE 16

This example further illustrates the effect of adding an epoxide to various resins. Stability was determined as described in Example 1; the results are set forth in Table 5.

TABLE 5

| Concentration as Wt. % of Initiator | Stability (Days at 65° C.) | | | |
|---|---|---|---|---|
| | Satomer[1] TMPTA | Celanese[2] TMPTA | Union Carbide[3] PETA | Satomer[4] PETA |
| None | 4.0 | <1.0 | <1.0 | <2.0 |
| 2.5% ERL-4221 | 82.0 | 1.0 | 15.0 | 1.0 |

[1]Initiator loading of 3.6% by weight of Satomer 351, which is trimethylolpropane triacrylate marketed by Satomer Company.
[2]Indicator loading of 3.6% by weight of trimethylolpropane triacrylate marketedby Celanese Corporation.
[3]Initiator loading of 1.2% by weight of pentaerythritol triacrylate marketed by Union Carbide Corporation.
[4]Initiator loading of 1.2% by weight of pentaerythritol tetraacrylate marketed by Satomer Company. The control was not inspected until 2 days after initiation of storage.

COMPARATIVE EXAMPLE

Acrylic acid in various concentrations was added to samples of Satomer SR 351 resin (trimethylolpropane triacrylate) containing 3.6% by weight of benzoin isobutyl ether. Stability was determined as described in Example 1. The results, which are set forth in Table 6, indicate that acid tends to decrease stability only at abnormally high concentrations. Thus, it appears that the epoxides are not necessarily functioning as acid acceptors in this invention.

TABLE 6

| Sample | Concentration of Acrylic Acid (% by Wt. of Resin) | Calculated Acid Number (Milligrams KOH/gram) | Stability (Days at 65° C.) |
|---|---|---|---|
| 1 | 0 | 0.26 | 4.4 (average of 6 samples) |
| 2 | 1.2 | 9.3 | 4.0 |
| 3 | 2.4 | 18.6 | 3.0 |
| 4 | 3.5 | 28.0 | 4.0 |
| 5 | 5.8 | 45.0 | 4.0 |
| 6 | 10.7 | 137.0 | 2.0 |

What is claimed is:

1. A photopolymerizable composition comprising at least one photopolymerizable ethylenically unsaturated compound containing a benzoin ether in an amount sufficient to initiate photopolymerization and a stabilizing amount of an epoxide having the formula:

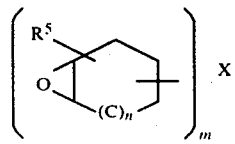

wherein:
R[5] is hydrogen or alkyl of 1 to 4 carbon atoms;
X is oxygen,

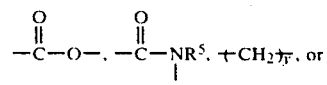

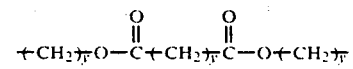

where y is an integer from 1 to 4, m being 2; or

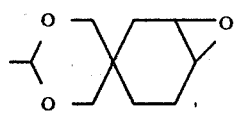

m being 1; and
n is zero or 1.

2. The composition of claim 1 wherein said benzoin ether is present in said composition at a concentration of about 0.01 to about 30 percent by weight, and said epoxide is present at a concentration of about 0.01 to about 20 percent by weight of said benzoin ether.

3. The composition of claim 1 wherein in said formula, $R^5$ is hydrogen or methyl; X is oxygen,

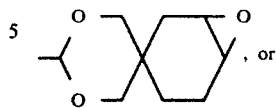, or

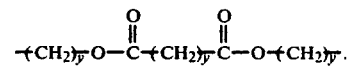.

4. The composition of claim 1 wherein the ethylenically unsaturated compounds consist essentially of derivatives of acrylic acid.

* * * * *

UNITED STATES PATENT AND TRADEMARK OFFICE
CERTIFICATE OF CORRECTION

PATENT NO. : 4,260,465
DATED : April 7, 1981
INVENTOR(S) : Francis A. Via

It is certified that error appears in the above-identified patent and that said Letters Patent are hereby corrected as shown below:

Col. 4, line 25 - "alkyenedioxy" should be -- alkylenedioxy --.

Col. 6, Example 1 - The epoxide structure should have a single bond between the benzene ring and carbon atom instead of a double bond.

Col. 7, line 56 - "Indicator" should be -- Initiator --.

Signed and Sealed this

Thirtieth Day of March 1982

[SEAL]

Attest:

Attesting Officer

GERALD J. MOSSINGHOFF
Commissioner of Patents and Trademarks

UNITED STATES PATENT AND TRADEMARK OFFICE
CERTIFICATE OF CORRECTION

PATENT NO. : 4,260,465
DATED : April 7, 1981
INVENTOR(S) : Francis A. Via

It is certified that error appears in the above–identified patent and that said Letters Patent are hereby corrected as shown below:

Col. 4, line 25, "alkvenedioxy" should be -- alkylenedioxy --;

Col. 6, Example 1, the epoxide structure, ERL-4221 should have two cyclohexane rings instead of two benzene rings. A single bond should be between the ring and carbon atom instead of a double bond;

Col. 7, line 56, "Indicator" should be -- Initiator --.

This certificate supersede certificate of correction of March 30, 1982.

Signed and Sealed this

Twenty-eighth Day of June 1983

[SEAL]

Attest:

GERALD J. MOSSINGHOFF

Attesting Officer    Commissioner of Patents and Trademarks